United States Patent
Chen et al.

(10) Patent No.: US 10,622,347 B2
(45) Date of Patent: Apr. 14, 2020

(54) ELECTROSTATIC DISCHARGE (ESD) PROTECTION STRUCTURE UTILIZING FLOOR PLAN DESIGN TO PROTECT INTEGRATED CIRCUIT FROM ESD EVENT, AND RELATED INTEGRATED CIRCUIT AND ESD PROTECTION METHOD

(71) Applicant: HIMAX TECHNOLOGIES LIMITED, Tainan (TW)

(72) Inventors: Hung-Yi Chen, Tainan (TW);
Ching-Ling Tsai, Tainan (TW)

(73) Assignee: HIMAX TECHNOLOGIES LIMITED, Tainan (TW)

(*) Notice: Subject to any disclaimer, the term of this patent is extended or adjusted under 35 U.S.C. 154(b) by 398 days.

(21) Appl. No.: 15/643,459

(22) Filed: Jul. 6, 2017

(65) Prior Publication Data
US 2019/0013309 A1    Jan. 10, 2019

(51) Int. Cl.
*H02H 9/00* (2006.01)
*H01L 27/02* (2006.01)
*H02H 9/04* (2006.01)

(52) U.S. Cl.
CPC ...... *H01L 27/0255* (2013.01); *H01L 27/0292* (2013.01); *H02H 9/046* (2013.01)

(58) Field of Classification Search
None
See application file for complete search history.

(56) References Cited

U.S. PATENT DOCUMENTS

| 7,002,218 | B2* | 2/2006 | Yach | H01L 27/0259 257/110 |
| 7,977,769 | B2* | 7/2011 | Chao | H01L 27/0259 257/330 |
| 8,466,514 | B2* | 6/2013 | Hsieh | H01L 27/0629 257/330 |
| 2006/0289935 | A1 | 12/2006 | Yu | |

FOREIGN PATENT DOCUMENTS

| TW | 201209993 A1 | 3/2012 |
| TW | 201640646 A | 11/2016 |
| TW | 201712868 A | 4/2017 |
| TW | 201724456 A | 7/2017 |

* cited by examiner

*Primary Examiner* — Stephen W Jackson
(74) *Attorney, Agent, or Firm* — Winston Hsu

(57) ABSTRACT

An electrostatic discharge protection (ESD) structure for protecting a core circuit of an integrated circuit from an ESD event received by a conductive pad of the integrated circuit is provided. The ESD protection structure includes a first conductive layer, a clamp device, a first electrical connection part and a second electrical connection part. The first conductive layer is formed below the conductive pad, and includes a first conductive portion, an insulating portion and a second conductive portion. The insulating portion is surrounded by the first conductive portion and the second conductive portion. The first conductive portion is electrically connected between the conductive pad and the second conductive portion. The clamp device is arranged for clamping the ESD event. The first electrical connection part is coupled between the first conductive portion and the clamp device. The second electrical connection part is coupled between the second conductive portion and the core circuit.

18 Claims, 7 Drawing Sheets

ELECTROSTATIC DISCHARGE (ESD) PROTECTION STRUCTURE UTILIZING FLOOR PLAN DESIGN TO PROTECT INTEGRATED CIRCUIT FROM ESD EVENT, AND RELATED INTEGRATED CIRCUIT AND ESD PROTECTION METHOD

BACKGROUND OF THE INVENTION

1. Field of the Invention

The disclosed embodiments of the present invention relate to electrostatic discharge (ESD) protection, and more particularly, to an ESD protection structure utilizing a floor plan design of a conductive layer to protect a core circuit of an integrated circuit from an ESD event, and related integrated circuit and ESD protection method.

2. Description of the Prior Art

In order to prevent a core circuit of an integrated circuit from being damaged due to an electrostatic discharge (ESD) current, the integrated circuit has a clamp circuit disposed therein to clamp the ESD current. However, once the ESD current flows into the core circuit before flowing into the clamp circuit, the integrated circuit cannot avoid ESD damage to the core circuit. Thus, there is a need for a novel ESD protection mechanism to improve ESD protection.

SUMMARY OF THE INVENTION

In accordance with exemplary embodiments of the present invention, an ESD protection structure utilizing a floor plan design of a conductive layer to protect a core circuit of an integrated circuit from an ESD event, and related integrated circuit and ESD protection method are proposed to solve the above-mentioned problems.

According to an embodiment of the present invention, an exemplary electrostatic discharge (ESD) protection structure is disclosed. The exemplary ESD protection structure is used for protecting a core circuit of an integrated circuit from an ESD event received by a conductive pad of the integrated circuit. The exemplary ESD protection structure comprises a first conductive layer, a clamp device, a first electrical connection part and a second electrical connection part. The first conductive layer is formed below the conductive pad, wherein the first conductive layer comprises a first conductive portion, an insulating portion and a second conductive portion, the insulating portion is surrounded by the first conductive portion and the second conductive portion, and the first conductive portion is electrically connected between the conductive pad and the second conductive portion. The clamp device is arranged for clamping the ESD event. The first electrical connection part is coupled between the first conductive portion of the first conductive layer and the clamp device. The second electrical connection part is coupled between the second conductive portion of the first conductive layer and the core circuit.

According to an embodiment of the present invention, an exemplary integrated circuit is disclosed. The integrated circuit comprises a conductive pad, a core circuit and an electrostatic discharge (ESD) protection structure. The ESD protection structure is coupled to the conductive pad and the core circuit, and is arranged for protecting the core circuit from an ESD event received by the conductive pad. The ESD protection structure comprises a first conductive layer, a clamp device, a first electrical connection part and a second electrical connection part. The first conductive layer is formed below the conductive pad, wherein the first conductive layer comprises a first conductive portion, an insulating portion and a second conductive portion, the insulating portion is surrounded by the first conductive portion and the second conductive portion, and the first conductive portion is electrically connected between the conductive pad and the second conductive portion. The clamp device is arranged for clamping the ESD event. The first electrical connection part is coupled between the first conductive portion of the first conductive layer and the clamp device. The second electrical connection part is coupled between the second conductive portion of the first conductive layer and the core circuit.

According to an embodiment of the present invention, an exemplary method for protecting a core circuit of an integrated circuit from an electrostatic discharge (ESD) event received by a conductive pad of the integrated circuit is disclosed. The exemplary method comprises the following steps: providing a first conductive layer below the conductive pad, wherein the first conductive layer comprises a first conductive portion, an insulating portion and a second conductive portion, the insulating portion is surrounded by the first conductive portion and the second conductive portion, and the first conductive portion is electrically connected between the conductive pad and the second conductive portion; coupling a first electrical connection part between the first conductive portion of the first conductive layer and a clamp device, wherein the clamp device is used for clamping the ESD event; and coupling a second electrical connection part between the second conductive portion of the first conductive layer and the core circuit.

By means of conductive path designs (e.g. floorplan/layout designs of a conductive/metal layer), the proposed ESD protection mechanism may preferentially conduct an ESD current to a clamp device to thereby prevent the ESD current from directly flowing into the core circuit. Additionally, the proposed ESD protection mechanism may have higher current capability (which may avoid/reduce electromigration (EM) effects) and lower parasitic capacitance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is electrically connected to another device, that connection may be through a direct electrical connection, or through an indirect electrical connection via other devices and connections.

Figure 1:
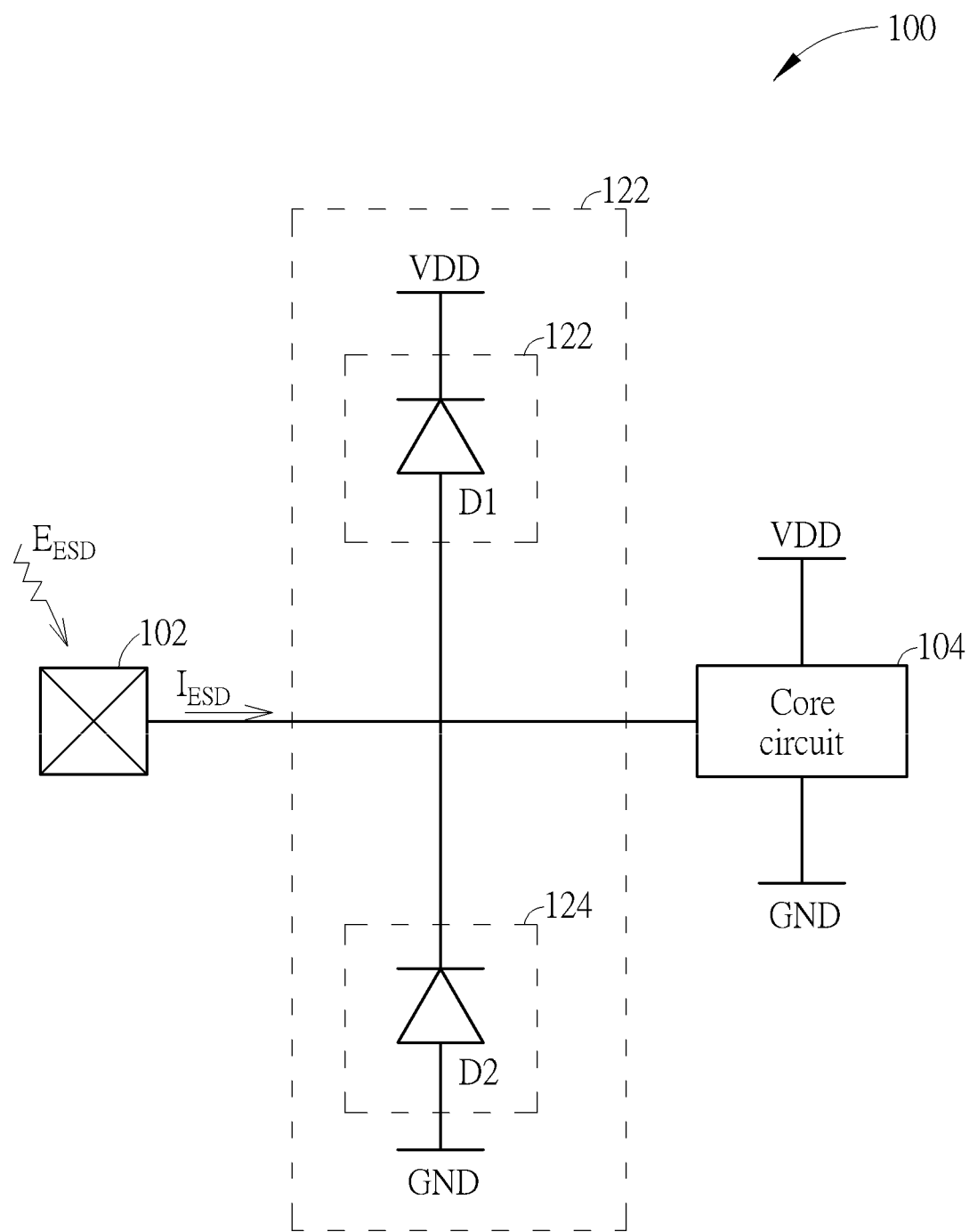
FIG. 1 is a block diagram illustrating an exemplary integrated circuit according to an embodiment of the present invention.

FIG. 1 is a block diagram illustrating an exemplary integrated circuit according to an embodiment of the present invention. The integrated circuit 100 may include, but is not limited to, a conductive pad 102, a core circuit 104 and an electrostatic discharge (ESD) protection structure 110. The core circuit 104 is coupled to a supply voltage VDD and a ground voltage GND, and may perform corresponding functions/operations (e.g. timing control or source driving) according to different control signals received from the conductive pad 102 (not shown in FIG. 1). The ESD protection structure 110 is coupled to the conductive pad 102 and the core circuit 104, and is arranged for protecting the core circuit 104 from an ESD event $E_{ESD}$ received by the conductive pad 102. In this embodiment, the ESD protection structure 110 may include, but is not limited to, a clamp device 122 and a clamp device 124, wherein the clamp device 122 is coupled between the conductive pad 102 and the supply voltage VDD to thereby clamp the ESD event $E_{ESD}$, and the clamp device 124 is coupled between the conductive pad 102 and the ground voltage GND to thereby clamp the ESD event $E_{ESD}$. By way of example but is not limitation, the clamp device 122 may be implemented by a diode D1, and/or the clamp device 124 may be implemented by a diode D2.

In order to avoid that an ESD current $I_{ESD}$ generated in response to the ESD event $E_{ESD}$ directly flows into the core circuit 104 rather than a clamp circuit (e.g. the clamp device 122/124), the ESD protection structure 110 may utilize conductive path designs (e.g. floorplan/layout designs of a conductive/metal layer) to control the flow of the ESD current $I_{ESD}$, thereby ensuring that the ESD current $I_{ESD}$ will not flow into the core circuit 104 before flowing into the clamp circuit. It should be noted that as ESD protection paths and operations associated with the diode D1 (the clamp device 122) shown in FIG. 1 are similar/identical to those associated with the diode D2 (the clamp device 124) shown in FIG. 1, an exemplary ESD protection mechanism is described with reference to the ESD protection paths associated with the diode D1 for the sake of brevity. Further description is provided below.

Figure 2:
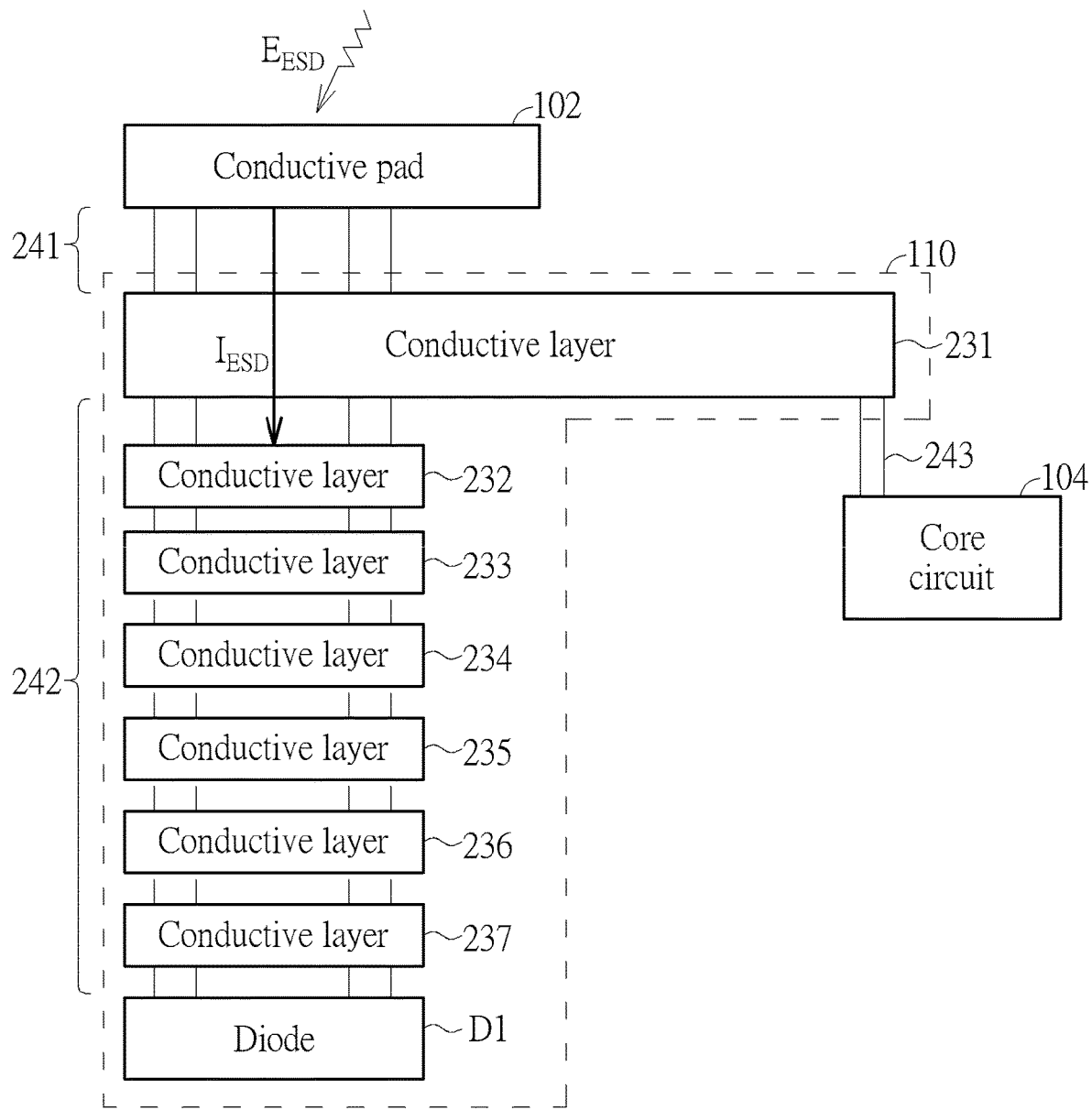
FIG. 2 is a diagram illustrating an exemplary partial structure of the electrostatic discharge protection structure shown in FIG. 1 according to an embodiment of the present invention.

Please refer to FIG. 2 in conjunction with FIG. 1. FIG. 2 is a diagram illustrating an exemplary partial structure of the ESD protection structure 110 shown in FIG. 1 according to an embodiment of the present invention. In this embodiment, the conductive pad 102 is coupled to the ESD protection structure 110 through an electrical connection part 241, which may conduct the ESD current $I_{ESD}$ from the conductive pad 102 to the ESD protection structure 110. In addition to the diode D1, the ESD protection structure 110 may include, but is not limited to, a plurality of conductive layers (e.g. metal layers) 231-237, an electrical connection part 242 and an electrical connection part 243, wherein each of the conductive layers 231-237 is formed below the conductive pad 102 and is electrically connected between the conductive pad 102 and the diode D1. Additionally, the conductive layer 231 is coupled to the diode D1 through the electrical connection part 242 so as to provide a conductive path between the conductive pad 102 and the diode D1, and is coupled to the core circuit 104 through the electrical connection part 243 so as to provide a conductive path between the conductive pad 102 and the core circuit 104.

Figure 3:
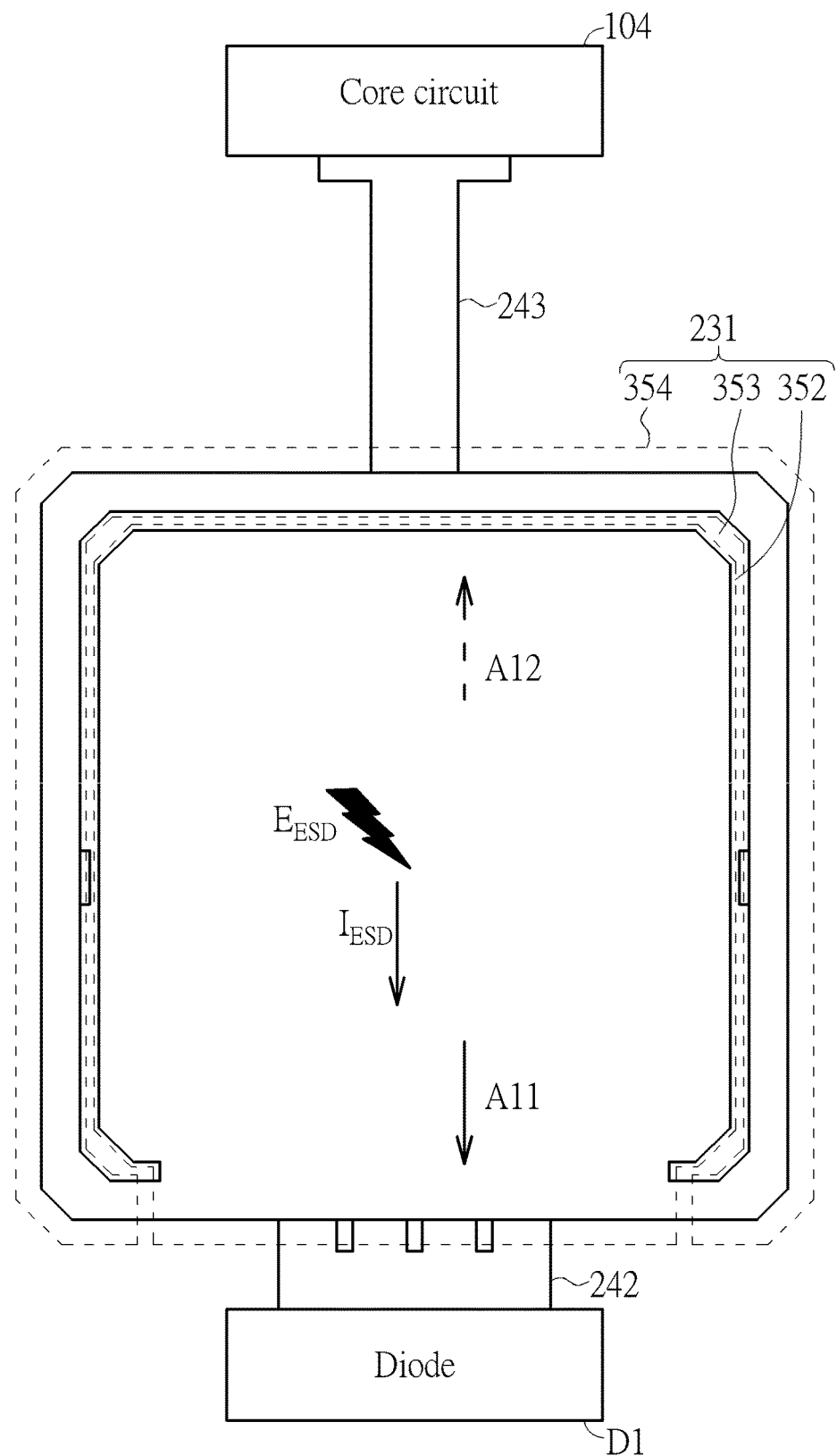
FIG. 3 is a diagram illustrating an exemplary floorplan layout of the conductive layer shown in FIG. 2 according to an embodiment of the present invention.

By means of conductive path designs, the ESD protection structure 110 may ensure that the ESD current $I_{ESD}$ will not flow into the core circuit 104 before flowing into the diode D1. Please refer to FIG. 2 and FIG. 3 together. FIG. 3 is a diagram illustrating an exemplary floorplan layout of the conductive layer 231 shown in FIG. 2 according to an embodiment of the present invention. In the embodiment shown in FIG. 3, the conductive layer 231 may include, but is not limited to, a first conductive portion 352, an insulating portion 353 and a second conductive portion 354, wherein the insulating portion 353 is surrounded by the first conductive portion 352 and the second conductive portion 354, and the first conductive portion 352 is electrically connected between the conductive pad 102 and the second conductive portion 354. Additionally, the electrical connection part 242 is coupled between the first conductive portion 352 of the conductive layer 231 and the diode D1, and the electrical connection part 243 is coupled between the second conductive portion 354 of the conductive layer 231 and the core circuit 104.

In a case where a current flows into the conductive layer 231 through the conductive pad 102, as the conductive layer 231 is electrically connected to the conductive pad 102 through the first conductive portion 352, the current may flows into the diode D1 or the core circuit 104 from the first conductive portion 352. By way of example but not limitation, the current may flow into the diode D1 through the first conductive portion 352 and the electrical connection part 242 in sequence (corresponding to a first conductive path), or flow into the core circuit 104 through the first conductive portion 352, the second conductive portion 354 and the electrical connection part 243 in sequence (corresponding to a second conductive path). It should be noted that the insulating portion 353 may have the current flowing into the conductive layer 231 flow in a direction toward the electrical connection part 242 (a conduction direction A11) rather than in a direction directly toward the electrical connection part 243 (a conduction direction A12). Once the current flows through the first conductive portion 352 of the conductive layer 231, all or almost all of the current may flow into the diode D1 through the electrical connection part 242 since the electrical connection part 242 is electrically connected to the diode D1. In other words, the aforementioned conductive path is the main conductive path of the current.

Hence, when the ESD event $E_{ESD}$ occurs, the conductive layer 231 may utilize the first conductive portion 352 to receive the ESD current $I_{ESD}$ coming from the conductive pad 102, and the electrical connection part 242 may conduct all or almost all of the ESD current $I_{ESD}$ to the diode D1 in order to clamp the ESD current $I_{ESD}$. With the aid of the conductive path designs, the conductive layer 231 may preferentially conduct the ESD current $I_{ESD}$ to the diode D1 through the first conductive portion 352 and the electrical connection part 242, thereby preventing the ESD current $I_{ESD}$ from directly flowing into the core circuit 104 rather than diode D1. In other words, before the ESD current $I_{ESD}$ flows into the core circuit 104 through the first conductive portion 352, the second conductive portion 354 and the electrical connection part 243, the electrical connection part 242 may have all or almost of all of the ESD current $I_{ESD}$ flow into the diode D1. Thus, the ESD protection structure 110 may ensure that all or almost of all of the ESD current $I_{ESD}$ will flow into the diode D1 rather than the core circuit 104.

In this embodiment, the insulating portion 353 may be implemented by an opening of the conductive layer 231 (e.g. an air gap opening). However, this is not meant to be a limitation of the present invention. For example, it is possible to utilize an electrically insulating material (e.g. a dielectric material) to implement the insulating portion 353. In another example, the insulating portion 353 may be an opening filled with an electrically insulating material. In brief, as long as the conductive layer 231 may include an insulating portion to prevent all or almost all of a received current from directly flowing into the electrical connection part 243 (i.e. along the conduction direction A12) rather than the electrical connection part 242, various modifications and alternatives fall within the scope of the prevent invention.

Additionally, in the embodiment shown in FIG. 2, the conductive layer 231 coupled to the core circuit 104 may be a top conductive layer formed over other conductive layers (i.e. the conductive layers 232-237), and therefore have a great thickness, higher current capability (which may avoid/reduce electromigration (EM) effects) and lower parasitic capacitance. Please note that this is not meant to be a limitation of the present invention. In an alternative design, a conductive layer coupled to the core circuit 104 may be one of the conductive layers 232-237 rather than a top conductive layer. In another alternative design, a conductive layer coupled to the core circuit 104 may one of the conductive layers 231-237 having a greater thickness than others.

The above is for illustrative purposes only, and is not intended to limit the scope of the present invention. For example, the number of conductive layers formed below the conductive pad 102 and the diode D1 shown in FIG. 2 is not meant to be a limitation of the present invention. In some embodiments, there may be one or multiple conductive layers formed between a conductive pad (e.g. the conductive pad 102 shown in FIG. 2) and a clamp device (e.g. the diode D1 shown in FIG. 2). Additionally, in some embodiments, the clamp device 122/124 shown in FIG. 1 may be implemented by other types of clamp circuits.

Figure 4:
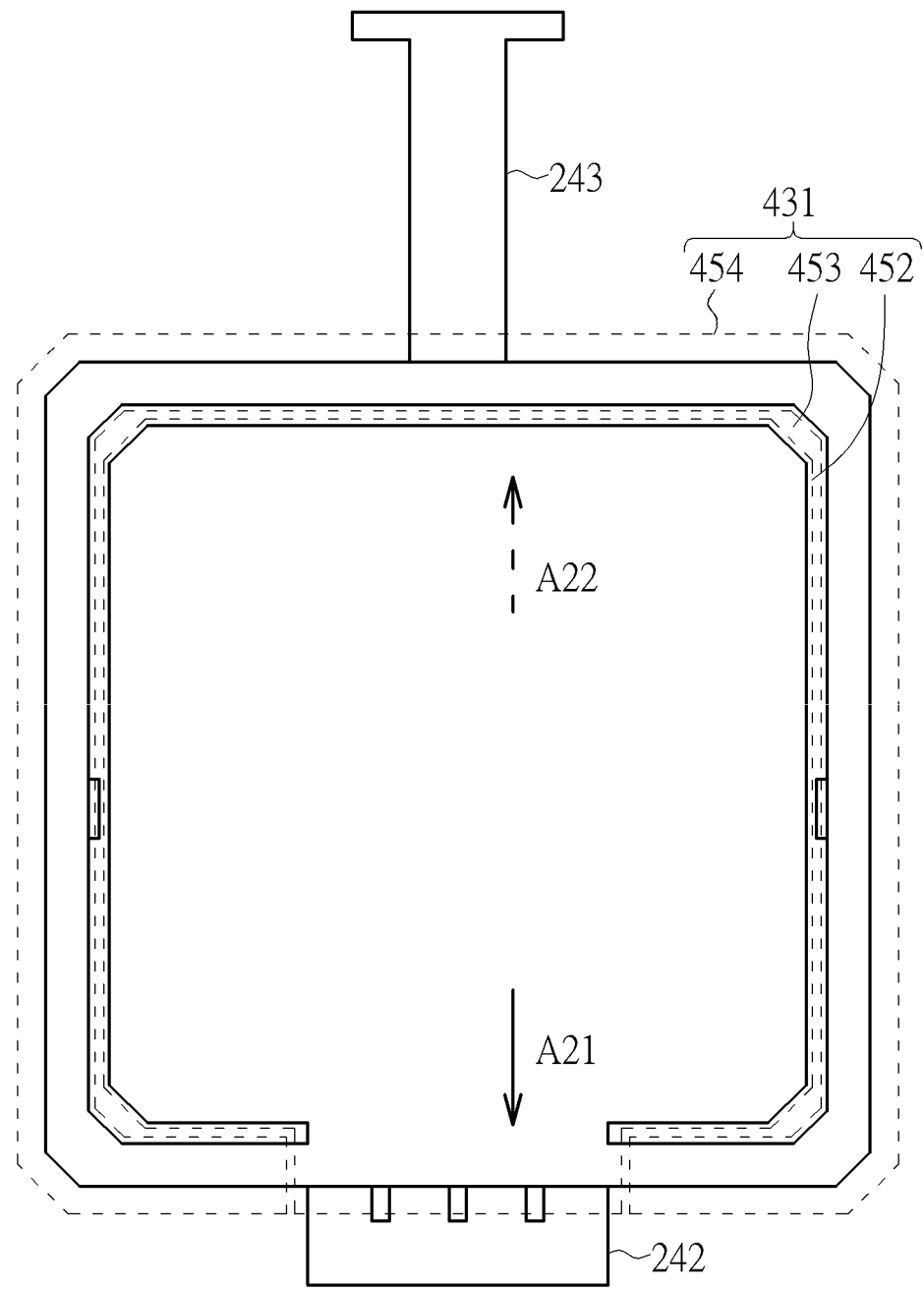
FIG. 4 illustrates an exemplary floorplan layout of the conductive layer shown in FIG. 2 according to an embodiment of the present invention.
Figure 5:
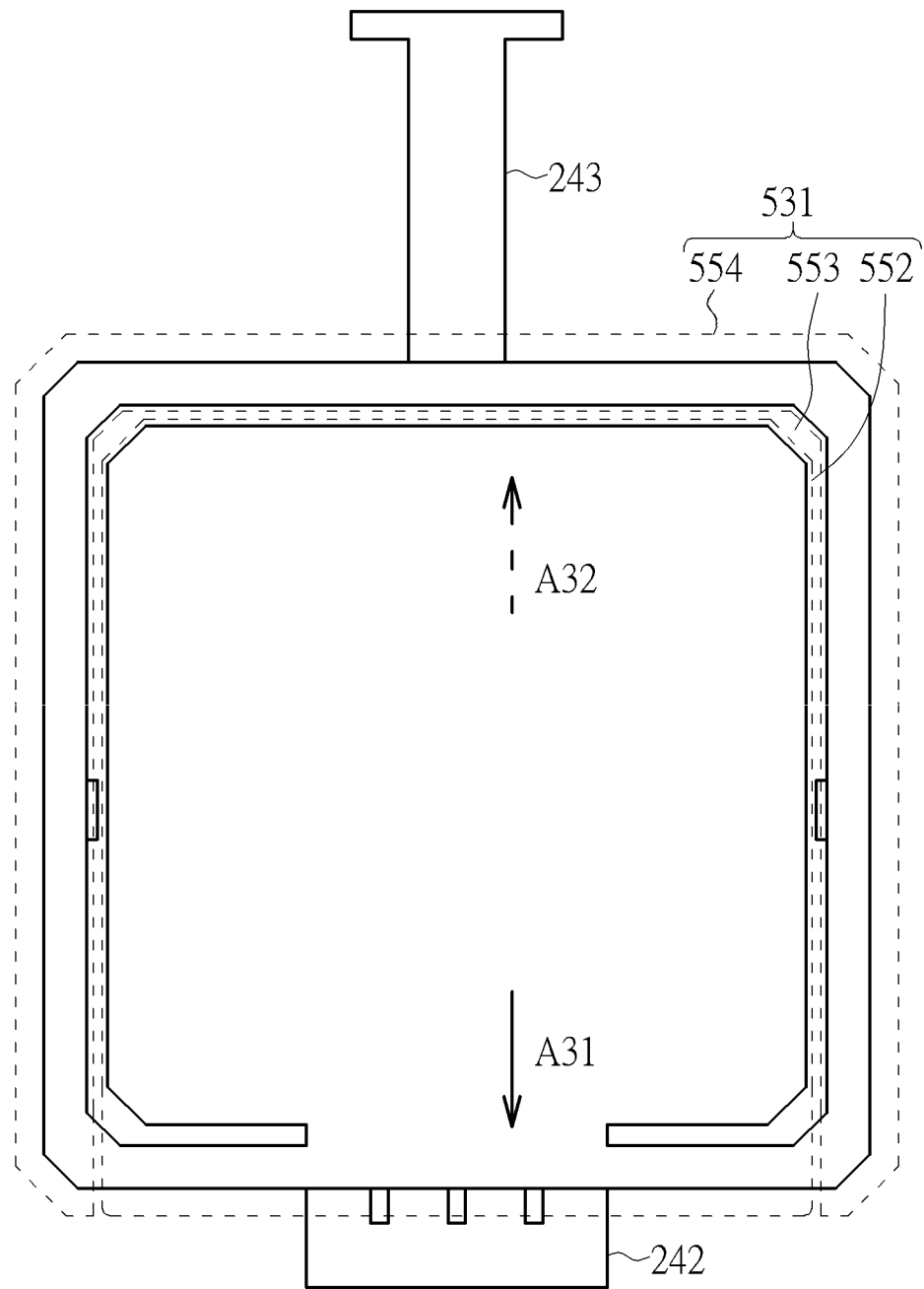
FIG. 5 illustrates an exemplary floorplan layout of the conductive layer shown in FIG. 2 according to an embodiment of the present invention.
Figure 6:
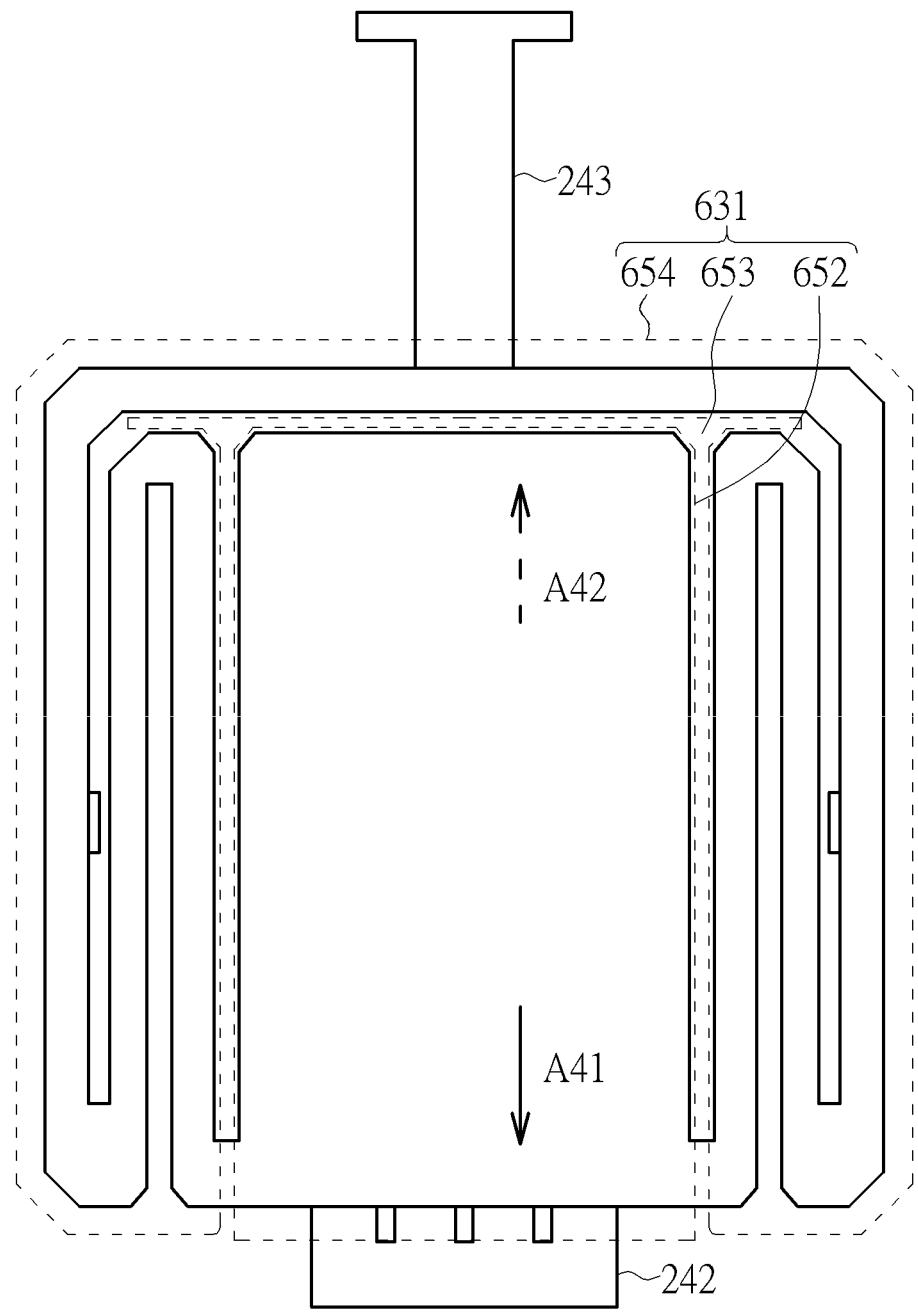
FIG. 6 illustrates an exemplary floorplan layout of the conductive layer shown in FIG. 2 according to an embodiment of the present invention.

The floorplan layout shown in FIG. 3 is for illustrative purposes only, and is not intended to limit the scope of the present invention. FIGS. 4-6 illustrate exemplary floorplan layouts of the conductive layer 231 shown in FIG. 2 according to embodiments of the present invention respectively. In the embodiment shown in FIG. 4, the insulating portion 453 of the conductive layer 431 may have a current (e.g. an ESD current) flowing into the first conductive portion 452 flow in a direction toward the electrical connection part 242 (a conduction direction A21), thereby preventing the current from directly flowing toward the electrical connection part 243 through the second conductive portion 454 (a conduction direction A22). In the embodiment shown in FIG. 5, the insulating portion 553 of the conductive layer 531 may have a current (e.g. an ESD current) flowing into the first conductive portion 552 flow in a direction toward the electrical connection part 242 (a conduction direction A31), thereby preventing the current from directly flowing toward the electrical connection part 243 through the second conductive portion 554 (a conduction direction A32). In the embodiment shown in FIG. 6, the insulating portion 653 of the conductive layer 631 may have a current (e.g. an ESD current) flowing into the first conductive portion 652 flow in a direction toward the electrical connection part 242 (a conduction direction A41), thereby preventing the current from directly flowing toward the electrical connection part 243 through the second conductive portion 654 (a conduction direction A42). As a person skilled in the art, after reading the above paragraphs directed to FIGS. 1-3, can readily understand that the proposed ESD protection mechanism shown in FIGS. 4-6 may preferentially conduct an ESD current to a clamp device to thereby prevent the ESD current from directly flowing into the core circuit, further description is omitted here for brevity.

Figure 7:
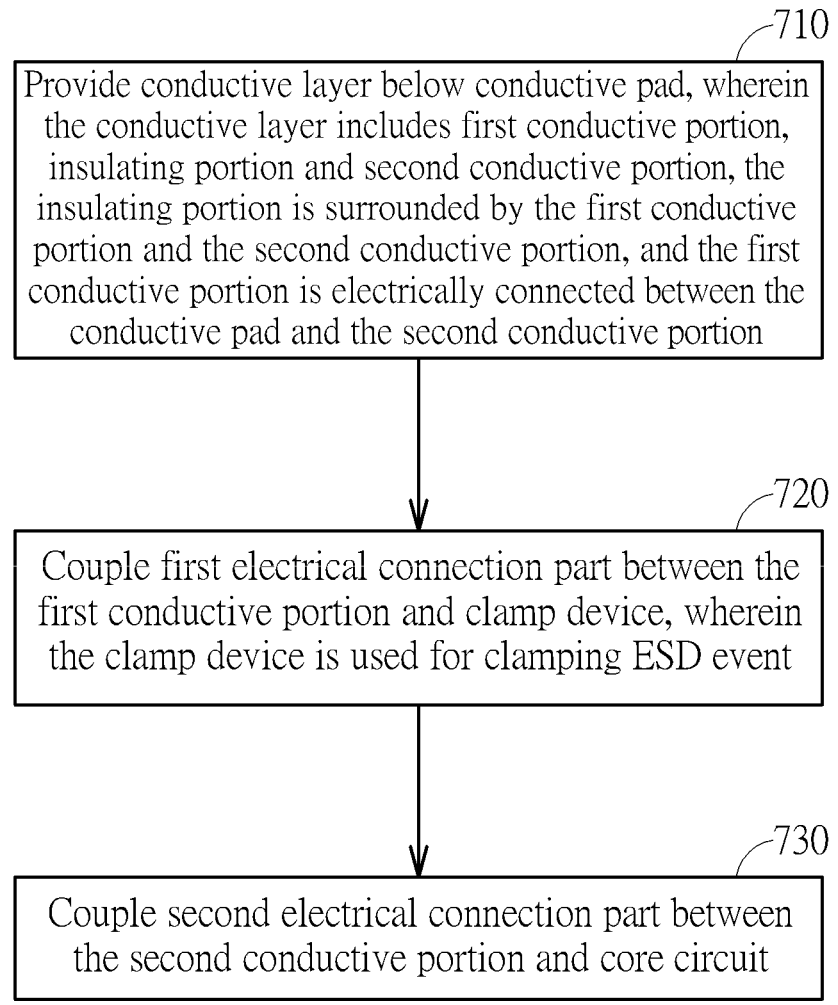
FIG. 7 is a flow chart of an exemplary method for protecting a core circuit of an integrated circuit from an electrostatic discharge event received by a conductive pad of the integrated circuit according to an embodiment of the present invention.

The proposed ESD protection mechanism may be summarized in FIG. 7. FIG. 7 is a flow chart of an exemplary method for protecting a core circuit of an integrated circuit from an ESD event received by a conductive pad of the integrated circuit according to an embodiment of the present invention. For illustrative purposes, the method shown in FIG. 7 is described with reference to the ESD protection structure 110 shown in FIG. 2 and FIG. 3. This is not meant to be a limitation of the present invention. Additionally, provided that the result is substantially the same, the steps are not required to be executed in the exact order shown in FIG. 7. For example, other intermediate steps can be added. The method shown in FIG. 7 may be summarized below.

Step 710: Provide the conductive layer 231 below the conductive pad 102, wherein the conductive layer 231 may include the first conductive portion 352, the insulating portion 353 and the second conductive portion 354. The insulating portion 353 is surrounded by the first conductive portion 352 and the second conductive portion 354, and the first conductive portion 352 is electrically connected between the conductive pad 102 and the second conductive portion 354.

Step 720: Couple the electrical connection part 242 between the first conductive portion 352 of the conductive layer 231 and a clamp device (the diode D1), wherein the clamp device is used for clamping the ESD event.

Step 730: Couple the electrical connection part 243 between the second conductive portion 354 of the conductive layer 231 and the core circuit 104.

In one implementation, when the ESD event occurs, the exemplary method may utilize the first conductive portion 352 of the conductive layer 231 to receive an ESD current generated in response to the ESD event. Additionally, before the ESD current flows into the core circuit 104 through the second conductive portion 354 and the electrical connection part 243, the exemplary method may utilize the electrical connection part 242 to conduct the ESD current to the clamp device. As a person skilled in the art can readily understand the operation of each step shown in FIG. 7 after reading the above paragraphs directed to FIGS. 1-6, further description is omitted here for brevity.

To sum up, by means of conductive path designs (e.g. floorplan/layout designs of a conductive/metal layer), the proposed ESD protection mechanism may preferentially conduct an ESD current to a clamp device to thereby prevent the ESD current from directly flowing into the core circuit. Additionally, the proposed ESD protection mechanism may have higher current capability (which may avoid/reduce EM effects) and lower parasitic capacitance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection structure for protecting a core circuit of an integrated circuit from an ESD event received by a conductive pad of the integrated circuit, the ESD protection structure comprising:
   a first conductive layer, formed below the conductive pad, wherein the first conductive layer comprises a first conductive portion, an insulating portion and a second conductive portion, the insulating portion is surrounded by the first conductive portion and the second conductive portion, and the first conductive portion is electrically connected between the conductive pad and the second conductive portion;
   a clamp device, for clamping the ESD event;
   a first electrical connection part, coupled between the first conductive portion of the first conductive layer and the clamp device; and
   a second electrical connection part, coupled between the second conductive portion of the first conductive layer and the core circuit;
   wherein when the ESD event occurs, the first conductive layer utilizes the first conductive portion to receive an ESD current generated in response to the ESD event, to allow the first electrical connection part to start conducting the ESD current to the clamp device before the ESD current flows into the core circuit through the second conductive portion and the second electrical connection part.

2. The ESD protection structure of claim 1, further comprising:
   at least one second conductive layer, formed below the conductive pad, wherein the at least one second conductive layer is electrically connected between the conductive pad and the clamp device;
   wherein the first conductive layer is a top conductive layer formed over the at least one second conductive layer.

3. The ESD protection structure of claim 1, further comprising:
   at least one second conductive layer, formed below the conductive pad, wherein the at least one second conductive layer is electrically connected between the conductive pad and the clamp device;
   wherein a thickness of the first conductive layer is greater than a thickness of each of the at least one second conductive layer.

4. The ESD protection structure of claim 1, wherein before the ESD current flows into the core circuit through the second conductive portion and the second electrical connection part, the first electrical connection part conducts the ESD current to the clamp device.

5. The ESD protection structure of claim 1, wherein the insulating portion is an opening of the first conductive layer.

6. The ESD protection structure of claim 1, wherein the clamp device comprises a diode.

7. An integrated circuit, comprising:
   a conductive pad;
   a core circuit; and
   an electrostatic discharge (ESD) protection structure, coupled to the conductive pad and the core circuit, the ESD protection structure arranged for protecting the core circuit from an ESD event received by the conductive pad, wherein the ESD protection structure comprises:
      a first conductive layer, formed below the conductive pad, wherein the first conductive layer comprises a first conductive portion, an insulating portion and a second conductive portion, the insulating portion is surrounded by the first conductive portion and the second conductive portion, and the first conductive portion is electrically connected between the conductive pad and the second conductive portion;
      a clamp device, for clamping the ESD event;
      a first electrical connection part, coupled between the first conductive portion of the first conductive layer and the clamp device; and
      a second electrical connection part, coupled between the second conductive portion of the first conductive layer and the core circuit;
      wherein when the ESD event occurs, the first conductive layer utilizes the first conductive portion to receive an ESD current generated in response to the ESD event, to allow the first electrical connection part to start conducting the ESD current to the clamp device before the ESD current flows into the core circuit through the second conductive portion and the second electrical connection part.

8. The integrated circuit of claim 7, wherein the ESD protection structure further comprises:
   at least one second conductive layer, formed below the conductive pad, wherein the at least one second conductive layer is electrically connected between the conductive pad and the clamp device;
   wherein the first conductive layer is a top conductive layer formed over the at least one second conductive layer.

9. The integrated circuit of claim 7, wherein the ESD protection structure further comprises:
   at least one second conductive layer, formed below the conductive pad, wherein the at least one second conductive layer is electrically connected between the conductive pad and the clamp device;
   wherein a thickness of the first conductive layer is greater than a thickness of each of the at least one second conductive layer.

10. The integrated circuit of claim 7, wherein before the ESD current flows into the core circuit through the second conductive portion and the second electrical connection part, the first electrical connection part conducts the ESD current to the clamp device.

11. The integrated circuit of claim 7, wherein the insulating portion is an opening of the first conductive layer.

12. The integrated circuit of claim 7, wherein the clamp device comprises a diode.

13. A method for protecting a core circuit of an integrated circuit from an electrostatic discharge (ESD) event received by a conductive pad of the integrated circuit, comprising:
   providing a first conductive layer below the conductive pad, wherein the first conductive layer comprises a first conductive portion, an insulating portion and a second conductive portion, the insulating portion is surrounded by the first conductive portion and the second conductive portion, and the first conductive portion is electrically connected between the conductive pad and the second conductive portion;
   coupling a first electrical connection part between the first conductive portion of the first conductive layer and a clamp device, wherein the clamp device is used for clamping the ESD event;

coupling a second electrical connection part between the second conductive portion of the first conductive layer and the core circuit; and when the ESD event occurs, utilizing the first conductive portion of the first conductive layer to receive an ESD current generated in response to the ESD event, to allow the first electrical connection part to start conducting the ESD current to the clamp device before the ESD current flows into the core circuit through the second conductive portion and the second electrical connection part.

14. The method of claim 13, further comprising:

providing at least one second conductive layer below the conductive pad, wherein the at least one second conductive layer is electrically connected between the conductive pad and the clamp device;

wherein the first conductive layer is a top conductive layer formed over the at least one second conductive layer.

15. The method of claim 13, further comprising:

providing at least one second conductive layer below the conductive pad, wherein the at least one second conductive layer is electrically connected between the conductive pad and the clamp device;

wherein a thickness of the first conductive layer is greater than a thickness of each of the at least one second conductive layer.

16. The method of claim 13, further comprising:

before the ESD current flows into the core circuit through the second conductive portion and the second electrical connection part, utilizing the first electrical connection part to conduct the ESD current to the clamp device.

17. The method of claim 13, wherein the insulating portion is an opening of the first conductive layer.

18. The method of claim 13, wherein the clamp device comprises a diode.

* * * * *